United States Patent
Vugts et al.

(10) Patent No.: US 12,042,979 B2
(45) Date of Patent: Jul. 23, 2024

(54) UNBALANCED ROLLER

(71) Applicant: MORPHOTONICS HOLDING B.V., Veldhoven (NL)

(72) Inventors: Ludovicus Vugts, Moergestel (NL); Jan Matthijs Ter Meulen, Eindhoven (NL); Adrianus Van Erven, Casteren (NL); Bram Johannes Titulaer, Veldhoven (NL)

(73) Assignee: MORPHOTONICS HOLDING B.V., Veldhoven (NL)

( * ) Notice: Subject to any disclaimer, the term of this patent is extended or adjusted under 35 U.S.C. 154(b) by 89 days.

(21) Appl. No.: 17/775,370

(22) PCT Filed: Nov. 24, 2020

(86) PCT No.: PCT/EP2020/083147
§ 371 (c)(1),
(2) Date: May 9, 2022

(87) PCT Pub. No.: WO2021/105092
PCT Pub. Date: Jun. 3, 2021

(65) Prior Publication Data
US 2022/0396025 A1    Dec. 15, 2022

(30) Foreign Application Priority Data
Nov. 26, 2019  (EP) .................................... 19211555

(51) Int. Cl.
B29C 59/00  (2006.01)
B29C 59/04  (2006.01)
B29L 31/00  (2006.01)

(52) U.S. Cl.
CPC ............ B29C 59/002 (2013.01); B29C 59/04 (2013.01); *B29L 2031/712* (2013.01)

(58) Field of Classification Search
None
See application file for complete search history.

(56) References Cited

U.S. PATENT DOCUMENTS

2004/0197712 A1   10/2004  Jacobson et al.
2019/0329575 A1*  10/2019  Ter Meulen ............. B41K 3/50

FOREIGN PATENT DOCUMENTS

EP      2 246 177 A1   11/2010
WO   2018/011208 A1    1/2018

OTHER PUBLICATIONS

Vijayaraghavan et al.; "Design and Fabrication of A Roller Imprinting Device for Microfluidic Device Manufacturing," Proceedings of the 2008 International Manufacturing Science and Engineering Conference, pp. 1-10; Retrieved from the Internet: URL:https://escholarship.org/content/qt88h5r4qw/qt88h5r4qw.pdf?t=lfbilt.
Mar. 3, 2021, International Search Report issued in International Patent Application No. PCT/EP2020/083147.
Mar. 3, 2021, Written Opinion issued in International Patent Application No. PCT/EP2020/083147.

* cited by examiner

*Primary Examiner* — Robert J Grun
(74) *Attorney, Agent, or Firm* — Oliff PLC

(57) ABSTRACT

An imprinting, texturing or embossing system for a roll-to-plate process including at least one roller and at least one device capable to exert a resetting force to the starting position of the imprinting process after imprinting wherein the roller is a freely rotating roller.

15 Claims, 5 Drawing Sheets

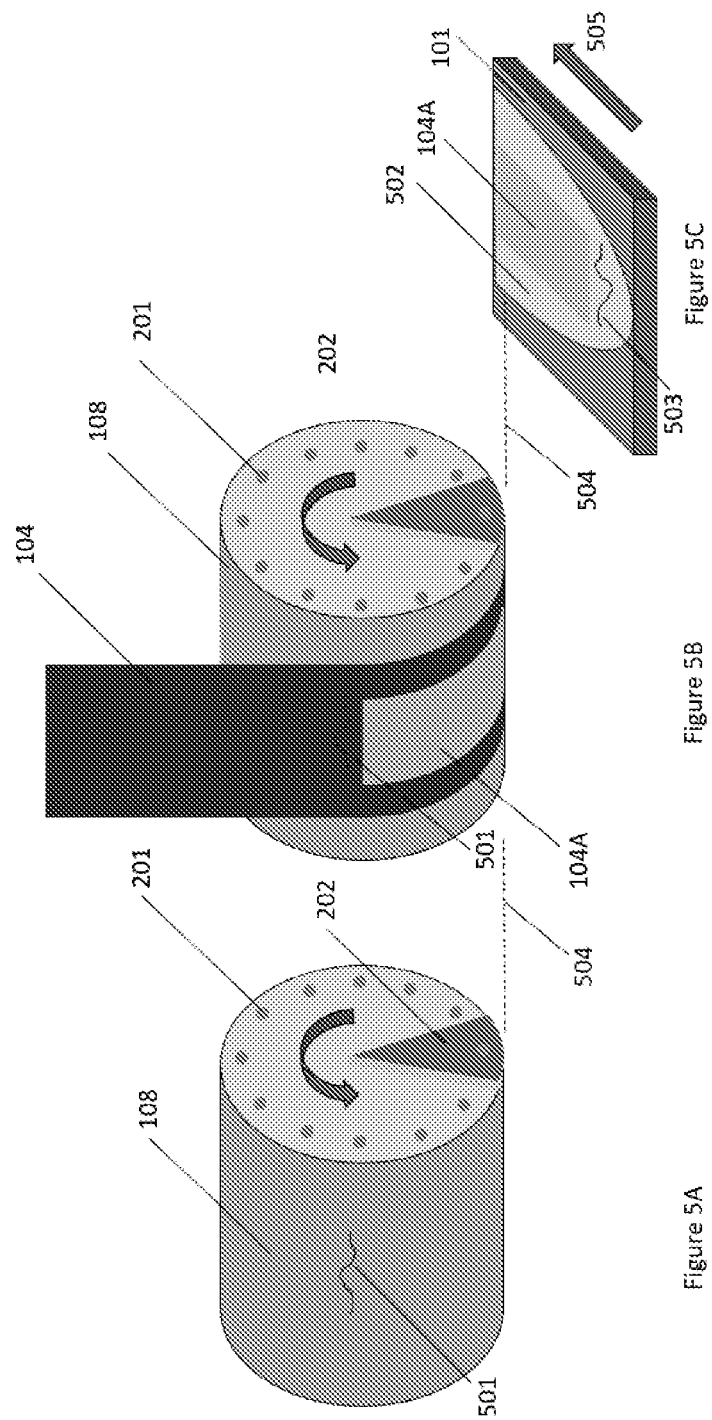

UNBALANCED ROLLER

The invention pertains to a roller for a roll-to-plate imprinting, texturing or embossing process using a flexible stamp.

In the known roll-to-plate imprinting process, a planar surface is textured using a roller which is either textured with the inverse of the structure to be imprinted or which presses a planar, flexible stamp into the surface to be imprinted as e.g. described in WO 2018/011208. For example, the application discloses an imprinting apparatus where a flexible stamp is fixated within clamps that are mounted on belts driven by rotating pulleys which are installed coaxially with rollers that can freely rotate. During imprinting, the flexible stamp is pressed by the imprinting roller onto a rigid, discrete planar substrate which is moving underneath the rollers using moving means (i.e. a carrier). Said rollers guide the movement of the flexible stamp that is driven by the pulley-belt-clamp system. In this apparatus, the flexible stamp has the form of a textured sheet. The flexible stamp is pressed onto the surface of the substrate, with curable resin in between, upon passage of the substrate underneath the rollers. The movement of the flexible stamp is steered and the flexible stamp is moving the rollers. The movement of the substrate is following the movement of the flexible stamp.

Another roll-to-plate process being described in US 2004/197712 A1 discloses a system for contact printing wherein a flexible stamp is attached to a spring that pulls it tight. A roller is rolled along the stamp bringing the stamp into contact with the substrate. In this process, the roller is not moved by the movement of the substrate but the substrate is fixed and the roller is moved overneath the substrate.

Other well-known imprint technologies are roll-to-roll imprinting as well as plate-to-plate imprinting. The advantage of roll-to-plate imprinting over roll-to-roll imprinting is that also rigid substrates or obtained products such as wafers can be imprinted. Compared to plate-to-plate imprinting, roll-to-plate imprinting allows for imprinting of larger substrates. Additionally using the roll-to-plate technology, nano- or micro structures can directly be applied onto large substrates or end products e.g. for manufacturing anti-reflective structures on solar panels or creating other optical effects such as a 3D effect for display panels through the use of micro-lenses.

It is disadvantageous in the current state of the art in roll-to-plate imprinting that the one or more freely rotatable rollers, i.e. the imprint roller and delamination roller, do not have defined starting positions for the imprint process. As the rollers are freely-rotating and not directly driven, they can have a different start position at each imprint. This would be unproblematic if the rollers were perfectly cylindrical shaped without any deformations and damages but in practice there often will be some imperfections to a certain degree. And even the smallest deviations from perfect uniformity of the roller are reflected in the imprinted product as the imprinting pressure exerted by the imprinting roller differs locally in case of a non-uniformity. As the starting position of the imprinting roller is not defined, the corresponding disturbances will be found at different locations for each imprint. This is a major difference to other imprinting technologies like roll-to-roll or plate-to-plate imprinting where similar anomalies can be located either on the plate or on the roll leading to a product with the anomaly found in the same repetitive position for every imprint cycle. For roll-to-plate imprinting using a flexible stamp and freely rotating rollers, this is not the case as the imprinting template is not linked to a fixed position of the imprinting roller as the pressure-exerting unit. Non-uniformities of the roller can therefore be reflected at different positions for each imprint.

Said problem is solved by the current invention comprising an imprinting, texturing or embossing system (108) for a roll-to-plate process comprising at least one roller (108) and at least one means (202) capable to exert a resetting force to the starting position of the imprinting process after imprinting characterized in that the roller is a freely rotating roller.

Throughout this application, the expressions "imprinting", "embossing" and "texturing" will be used synonymously.

Throughout this application, the term "means" will mean both singular and plural unless otherwise stated.

A roller according to the invention can either be hollow or massive. The roller can be made of any material such as metal or rubber. Also combinations of different materials might be used such as a metal core covered by rubber. Preferably, the rubber coating has a thickness of more than 3 mm. In an embodiment, the rollers can also comprise means for heating such as electric resist heaters. A roller to be used in the present invention preferably has a cylindrical lateral surface without any kinks, protrusions or patterns.

A predefined position according to the invention is a line on the circumferential surface of the roller which is parallel to the rotational axis of the roller and which is aligned with a certain line-position on the surface of the substrate which is equivalent in every imprinting process such that in every imprinting process the same flat projection of the circumferential surface of the roller is in contact with the surface of the substrate. In a preferred embodiment of the invention, the predefined position to which the roller can be reset is linked to the starting position of the imprint, which is the position of the first contact between the flexible stamp and the substrate and which then allows to always start the imprint at the same roller position. This provides every substrate with the same imprint quality as it receives the imprint from a predefined track on the circumference of the roller.

More preferred, the starting position is chosen in a way that any influence of a non-uniformity of the roller such as scratches, burrs or dents on the imprint quality is avoided or minimized. As example, in the case of an imprint process using a flexible stamp with a tiled array of multiple product areas, the roller defects can be positioned at stitch areas in between the product tiles. In this case the imprint quality of the active area is not or less disturbed. Other possible irregularities from which the effects can be handled by means of the invention are irregularities of the roller originating from its manufacturing process such as e.g. slight bendings or deviations parallel to the roller width. In these cases, still a reproducible result of imprinting is assured as the substrate receives the imprint from a predefined track on the circumference of the roller.

This allows to obtain an imprinting product of defined and constant quality without instantly having to exchange a roller when first signs of wear show up enabling a more efficient use of material in the production process.

Advantageously, the invention reduces the precision requirements concerning the roller which allows for cheaper production and a larger tolerance to wear and tear defects of the roller. Furthermore, requirements concerning the manufacturing quality of the roller are less strict. The rentability of the imprinting process can be significantly increased using the invention.

In a preferred embodiment, the means for exerting the resetting force are mounted on one or more mounting points off the roller's rotation axis in order to transform the resetting force into a torque which is strong enough to reset the roller into the predefined position. Advantageously, the means are mounted in a way that they can easily be removed without leaving any remainders at the roller and without putting any damage to the roller. Depending on the embodiment, the means may be fixed using force-fit, form-fit or other fixation techniques. The radial deviation of the one or more mounting points from the rotation axis of the roller depends on the moment of inertia and the diameter of the roller as well as on the strength of the resetting force. In a more preferred embodiment, the one or more mounting points are located at one or both face sides of the roller, inside a hollow roller and/or on the circumferential shell of the roller close to the face sides of the roller to obtain a maximum torque at a defined strength of the resetting force. Placement of the means inside the roller is especially advantageous as in such case they have least potential of disturbing the imprinting process. By the preferred position of the means, the resetting force can be exerted to the roller without hindering use of other building elements of the imprinting apparatus.

In a more preferred embodiment, the one or more mounting points are holes, preferably threaded holes, bolts, preferably threaded bolts, rods or spikes, straight or curved slots, rails, clamps, hooks, loops, anchors or magnets which are either incorporated into the material of the roller or installed on the outside of the roller using holes, bolts, rods or spikes, slots or using magnetic forces. An advantage of this embodiment is that the means can be fixed in various positions on the roller and to also use more than one means in order to vary the strength of the resetting force. Additionally, existing rollers can be upgraded with the means as applied in the invention.

The one or more mounting points can receive complementary fixation elements of the means such as threaded or unthreaded bolts, rods or spikes, screws, anchors, threaded or unthreaded holes, rails, straight or curved slots, clamps, hooks, anchors or magnets. In a further embodiment, the means are adhered to the roller using any kind of glue such as solvent-based glue, hot-melt glue or two-component glue offering a large amount of flexibility in the choice of the mounting point. Preferably the glue is chosen such that it can be removed without remains from the roller and without damage of the material of the roller. Use of glue for the fixation of the means offers a large amount of flexibility in the choice of the fixation point and furthermore facilitates upgrading of existing facilities lacking any other mounting points in an advantageous manner.

More preferably, the mounting point is a concentric circle in reasonable radius around the rotational axis of the roller forming e.g. a circular rail, a circular slot or a magnetic unit such as a magnetic ring or disc to receive the means using fixation elements such as clamps, bolts, loops, hooks, anchors or magnets which allows to fix the means in an arbitrary angular position and therefore choose a preferred position with great precision as the predefined position and to also change the predefined position as simply as possible if necessary, e.g. in case the roller has received damage which has to be circumvented in the imprinting process.

In an embodiment of the invention, the means to exert the resetting force can be springs such as spiral springs, leaf springs or rotational springs.

In another embodiment, the means to exert the resetting force may be magnets or electromagnets. This embodiment of the invention is especially advantageous as magnets can very easily be installed also to an existing roller either by just attaching them to a magnetic roller in the sought-after position or by using e.g. a magnetic disc or foil attached to the roller using e.g. glue. The use of electromagnets offers the additional advantage that the resetting force can also be switched off if needed.

In another embodiment the means to exert the resetting force is a motor, which steers the freely rotating roller to the preferred position after the imprint process. The motor can drive the imprint roller by use of a gear, belt or roller. As example a second roller, being in contact with the imprint roller after the imprint cycle, can rotate the imprint roller to a predefined position. In this case the imprint roller will need means to determine the position of the roller.

In the preferred embodiment, just one means exerts the resetting force to the roller. In a further embodiment, two or more means which may for themselves exert different resetting forces are mounted to different positions of the roller in order to make sure that the roller cannot be caught in a metastable position.

In a preferred embodiment the means to exert the resetting force are one or more items which are attached to the roller and which exert the resetting force by their mass and reset the roller to a predefined position due to the attractive force caused by gravity. In contrast to other means, items with additional mass allow for a proper resetting to the predefined position also in cases where the roller has conducted a full rotation since they are not damaged by overbending as it may occur with springs. Furthermore, items with additional mass show most resistance against wear or damage when used as means to exert the resetting force In a preferred embodiment of the invention, the mass added to the roller by mounting the items is not more than 5%, mostly preferred not more than 2% of the mass of the roller in order to make sure that the imbalance added to the roller by the items is large enough to exert the sought-after resetting force but small enough to make sure that the imbalance induced by the mass pieces has no or a negligible effect on the result of the imprinting and also does neither provide damage or additional wear to the roller nor to the flexible stamp, the substrate, the belts, the carrier or other devices involved in the imprinting process.

In a preferred embodiment, the additional items which exert the resetting force by their mass are shaped in a way that they do neither outstand the roller's diameter nor touch the flexible stamp or the driven belts and therefore do not disturb the imprinting process by friction or other kinds of mechanical interaction with the flexible stamp, the belts, the substrate or other devices involved in the imprinting process. This embodiment facilitates upgrading of existing facilities in an advantageous manner.

In a preferred embodiment the roller diameter is chosen to have a circumference which is larger than the length of the substrate to be imprinted in the direction of imprinting. If a carrier is used in the roll-to-plate imprint apparatus, the roller circumference is preferably larger than the length of the carrier in the imprint direction. Hereby defects on the roller can be positioned, by use of the imbalance outside of the imprint area.

In a preferred embodiment of the invention, items which exert the resetting force by their mass of different masses have the same dimension in order to allow for optimal fit with the dimension of the apparatus. This can be achieved by using different items of the same dimension made from materials of different density such as tin, steel, brass, copper or lead. Also non-metallic materials such as ceramics may be used. In a further embodiment, the items may be small, preferably rigid containers which can be filled with variable amounts of water, other liquids or bulk goods such as sand.

DESCRIPTION OF FIGURES

The figures show a preferred embodiment of the invention, however they do not limit the description of the invention to this embodiment in any sense and have just illustrative character. Indicating numbers occurring in more than one figure mean the same in all figures.

FIG. 5A shows the same embodiment of the roller as FIG. 2 with the roller 108 and the mass piece 202 where the roller is damaged by a scratch 501 which would result in a faulty imprint. The rotation direction of the roller during the imprinting process is indicated by the curved arrow.

FIG. 5B shows the imprinting process using the roller 108 with the scratch 501 and using the flexible stamp 104.

FIG. 5C shows the possible result of the imprint process 502, containing cured resin 109, using the damaged roller 108 with the image of the scratch 503 outside of the active area 104A. The vertical line 504 indicates the starting point, depending on the predefined position of the imprint process, due to the mass piece 202 while the arrow 505 indicates the direction of the imprinting process on the substrate 101. This process makes sure that the image of the scratch is always located at the same position on the imprint and may therefore be located in an area where it does not cause problems in the imprint.

Figure 1:
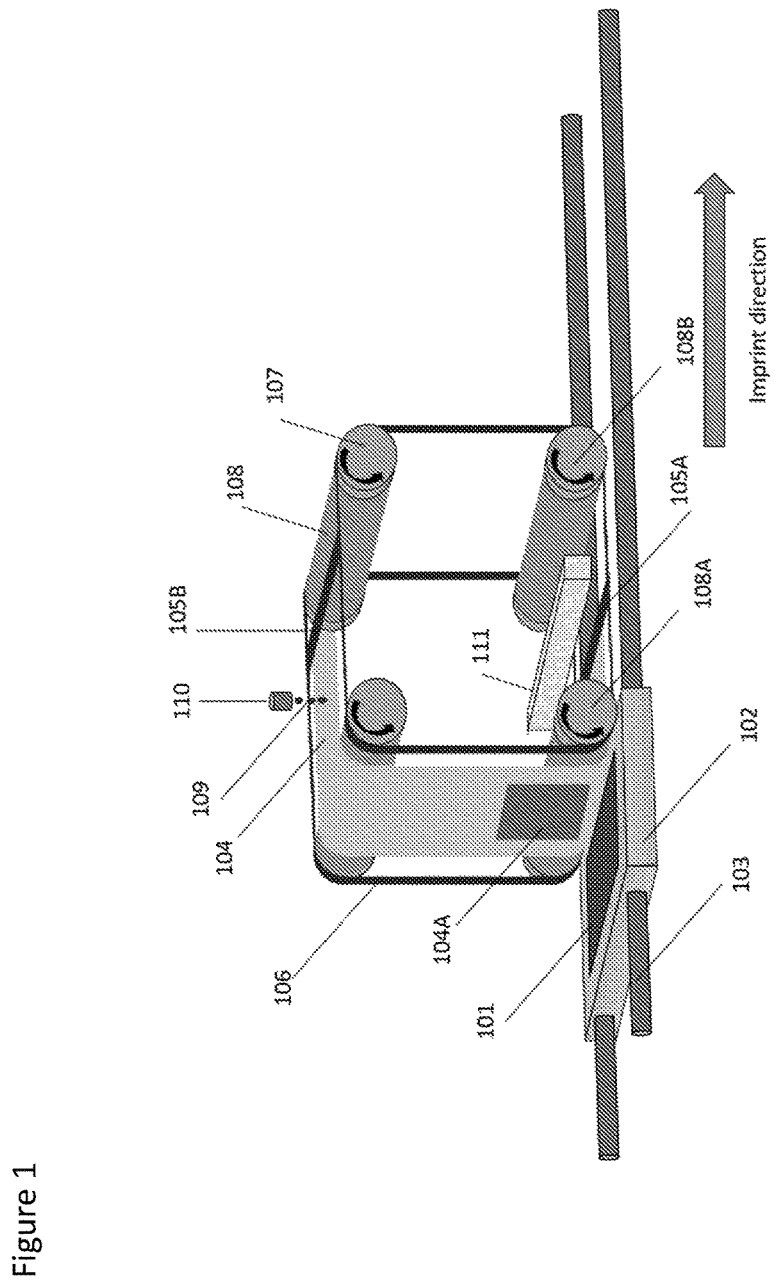
FIG. 1 shows schematically an imprinting apparatus to be used with an unbalanced roller according to the present invention. In this apparatus, a planar substrate 101 which is placed on a carrier 102 is moving on moving means 103 underneath a set of non-driven imprinting rollers 108. Imprinting is done by a textured foil 104 which is used as a flexible stamp with an active area 104A carrying the imprinting or embossing pattern. The flexible stamp is fastened to belts 106 using a first clamp 105A and a second clamp 105B. The belt is guided over driven pulleys 107 which rotate independently of the rollers 108. Therefore the rollers are only rotating passively following the movement of the textured foil 104. The flexible stamp is coated with an imprinting lacquer 109 being released from a nozzle 110 which is then carried onto the substrate 101 and cured using the UV lamp 111. Note that the lacquer 109 can also be directly applied on the substrate 101.
Figure 2:
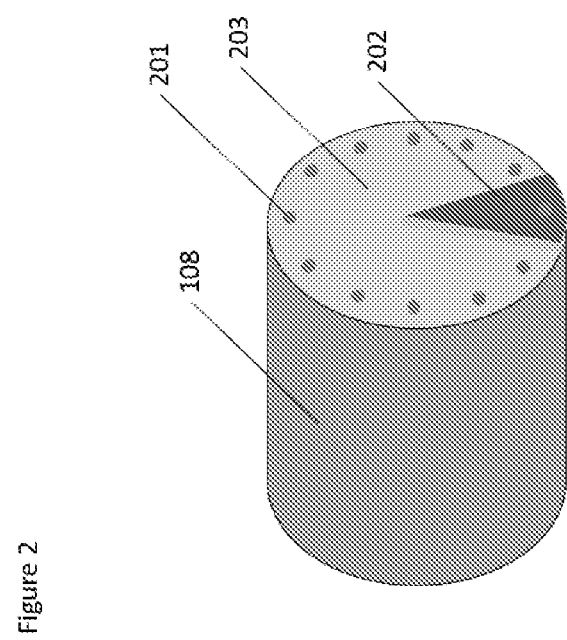
FIG. 2 shows a detailed view of a roller 108 in a preferred embodiment of the invention with mounting holes 201 on the facing side 203 to which an item which exerts the resetting force by its mass 202 is mounted.
Figure 3:
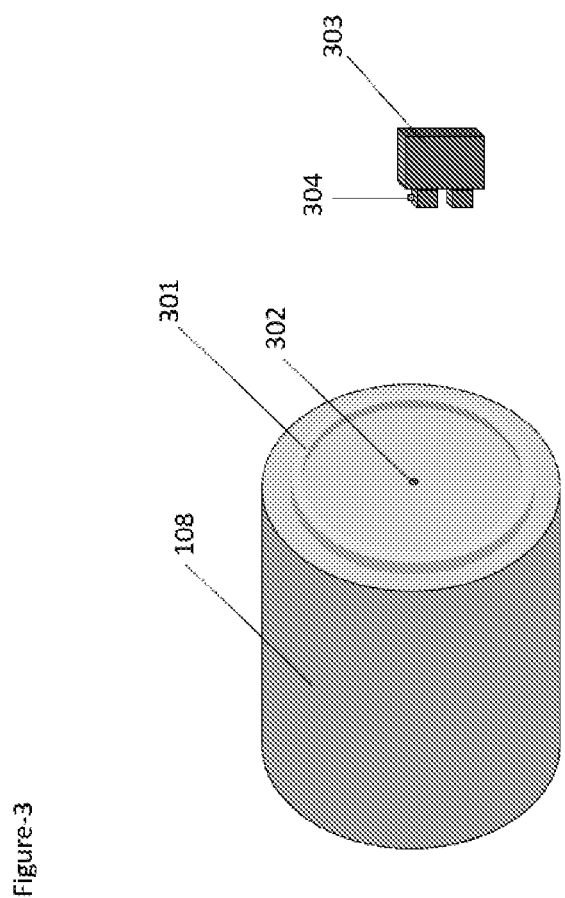
FIG. 3 shows another embodiment of the roller 108 with a rotational axis 204 and a concentric circular rail 301 mounted on the roller's face side 203. A block-sized item which exerts the resetting force by its mass 303 is equipped with a clamp 304 which allows to fix it to the rail 301.
Figure 4:
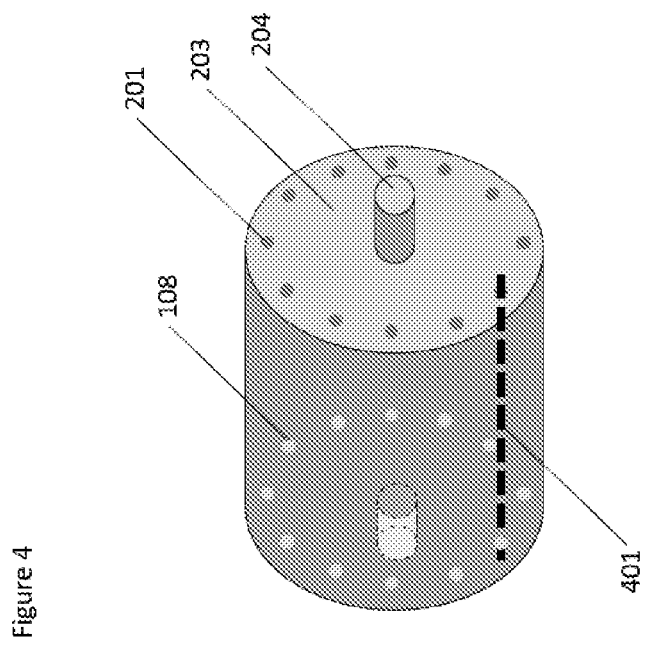
FIG. 4 shows another embodiment of the roller 108 from FIG. 2 with a rotational axis 204 and mounting holes 201 on the facing side 203 to which a metal rod 401 as item with additional mass is fixed inside the roller 108.

The invention claimed is:

1. An imprinting, texturing or embossing system for a roll-to-plate process comprising at least one roller and at least one means capable to exert a resetting force to the starting position of the imprinting process after imprinting, wherein the roller is a freely rotating roller, wherein the means to exert a resetting force are comprised in or connected to the at least one roller.

2. The system according to claim 1 wherein the roller has at least one mounting point for the means.

3. The system according to claim 2 wherein the mounting points being one or more holes, gears or magnets.

4. The system according to claim 2 wherein the means are mountable over the whole circumference of the roller.

5. The system according to claim 2 wherein the means being mountable on a circular ring, slot or disc fixed to the roller.

6. The system according to claim 1 wherein the means are one or more items which exert the resetting force by their mass.

7. The system according to claim 6 wherein the items which exert the resetting force by their mass having an additional mass of not more than 5% of the mass of the roller.

8. The system according to claim 6 wherein the items which exert the resetting force by their mass are mounted not surpassing the roller's diameter.

9. The system according to claim 6 wherein the items which exert the resetting force by their mass are mounted in the inner area of the roller.

10. The system according to claim 1 wherein the means is a spring.

11. The system according to claim 10 wherein the means is a spiral, leaf or rotational spring.

12. The system according to claim 1 wherein the means is a magnet or an electromagnet.

13. The system according to claim 1 wherein two or more means exert the same or different resetting forces and wherein said means are mounted at different positions of the roller.

14. The system according to claim 1 wherein the means is a motor.

15. The system according to claim 1 wherein the circumference of the roller is larger than the length of the substrate and/or larger than the length of the carrier.

\* \* \* \* \*